United States Patent
Kasai et al.

(10) Patent No.: US 10,469,957 B2
(45) Date of Patent: *Nov. 5, 2019

(54) CAPACITIVE TRANSDUCER AND ACOUSTIC SENSOR

(71) Applicant: OMRON Corporation, Kyoto (JP)

(72) Inventors: Takashi Kasai, Shiga (JP); Yuki Uchida, Shiga (JP)

(73) Assignee: Omron Corporation, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/901,830

(22) Filed: Feb. 21, 2018

(65) Prior Publication Data

US 2018/0184212 A1 Jun. 28, 2018

Related U.S. Application Data

(63) Continuation of application No. PCT/JP2017/002970, filed on Jan. 27, 2017.

(30) Foreign Application Priority Data

Mar. 10, 2016 (JP) .................. 2016-047521

(51) Int. Cl.
*H04R 19/04* (2006.01)
*H04R 19/00* (2006.01)
(Continued)

(52) U.S. Cl.
CPC .............. *H04R 19/04* (2013.01); *B81B 3/00* (2013.01); *H01L 29/84* (2013.01); *H04R 1/222* (2013.01);
(Continued)

(58) Field of Classification Search
CPC ...... H04R 19/04; H04R 19/005; H04R 1/222; B81B 2201/0257; B81B 2201/0264; B81B 2201/003
See application file for complete search history.

(56) References Cited

U.S. PATENT DOCUMENTS 8,111,871 B2  2/2012 Zhang et al.
8,737,171 B2  5/2014 Jenkins et al.
(Continued)

FOREIGN PATENT DOCUMENTS

CN  102100086 A  6/2011
CN  102238461 A  11/2011
(Continued)

OTHER PUBLICATIONS

International Search Report issued in Application No. PCT/JP2017/002970, dated Apr. 18, 2017 (1 page).
(Continued)

*Primary Examiner* — Sunita Joshi
(74) *Attorney, Agent, or Firm* — Osha Liang LLP (57) ABSTRACT

A capacitive transducer includes a substrate having an opening in a surface thereof, a back plate facing the opening in the substrate, a vibration electrode film facing the back plate across a space, the vibration electrode film being displaceable to have a displacement converted into a change in capacitance between the vibration electrode film and the back plate, an airflow channel defined by a gap between a protrusion integral with the back plate and a part of the vibration electrode film, the airflow channel being configured to increase an area of air flow when the vibration electrode film deforms under pressure to move relative to the protrusion integral with the back plate and relieve the pressure applied to the vibration electrode film to serve as a pressure relief channel, and an extension formed at a periphery of a hole in the vibration electrode film defining the pressure relief channel.

15 Claims, 12 Drawing Sheets

(51) Int. Cl.
  *H04R 1/22* (2006.01)
  *H01L 29/84* (2006.01)
  *B81B 3/00* (2006.01)

(52) U.S. Cl.
  CPC .... *H04R 19/005* (2013.01); *B81B 2201/0257* (2013.01); *B81B 2201/0264* (2013.01); *H04R 2201/003* (2013.01)

(56) References Cited

U.S. PATENT DOCUMENTS

| | | | |
|---|---|---|---|
| 8,983,097 B2 | 3/2015 | Dehe et al. | |
| 9,002,037 B2 | 4/2015 | Dehe et al. | |
| 9,549,263 B2 | 1/2017 | Uchida | |
| 2010/0212432 A1* | 8/2010 | Kasai | H04R 19/005 73/654 |
| 2013/0069179 A1 | 3/2013 | Ishimoto et al. | |
| 2015/0078592 A1* | 3/2015 | Uchida | H04R 19/04 381/191 |
| 2015/0369653 A1 | 12/2015 | Inoue | |

FOREIGN PATENT DOCUMENTS

| | | |
|---|---|---|
| JP | 2008-259061 A | 10/2008 |
| JP | 2011-250170 A | 12/2011 |
| JP | 2015-056832 A | 3/2015 |

OTHER PUBLICATIONS

Written Opinion issued in Application No. PCT/JP2017/002970, dated Apr. 18, 2017 (3 pages).
Extended European Search Report issued in European Application No. 17762744.5, dated Feb. 12, 2019 (9 pages).
Office Action in counterpart Chinese Patent Application No. 201780002667.7 dated Jul. 29, 2019 (6 pages).

* cited by examiner

CAPACITIVE TRANSDUCER AND ACOUSTIC SENSOR

BACKGROUND

Field

The disclosure relates to a capacitive transducer and an acoustic sensor including the capacitive transducer. The present invention particularly relates to a capacitive transducer with a capacitor structure including a vibration electrode film with the MEMS technology and a back plate, and to an acoustic sensor including the capacitive transducer.

Related Art

Small microphones known in the art may incorporate acoustic sensors called electret condenser microphones (ECMs). However, ECMs are susceptive to heat and are less suited to digitization and miniaturization than microphones incorporating capacitive transducers fabricated using the micro electro mechanical systems (MEMS) technology (hereafter, MEMS microphones). Thus, MEMS microphones have been increasingly used (refer to, for example, Patent Literature 1).

A capacitive transducer fabricated using the MEMS technology may include a vibration electrode film that vibrates under pressure and a back plate to which an electrode film is fixed. The vibration electrode film and the back plate are arranged to face each other across a space. The capacitive transducer with this structure may be achieved by, for example, forming a vibration electrode film on a silicon substrate, a sacrificial layer over the vibration electrode film, and a back plate on the sacrificial layer, and then removing the sacrificial layer. The MEMS technology, which is based on the semiconductor fabrication technology, enables fabrication of very small capacitive transducers.

However, capacitive transducers fabricated using the MEMS technology include a thin vibration electrode film and a thin back plate. The thin vibration electrode film may deform greatly and break under an excessively high pressure. The capacitive transducer may have this disadvantage when, for example, receiving an air blow in its mounting process or when the capacitive transducer falls, in addition to when receiving a large sound pressure.

In response to this, the vibration electrode film may have a pressure relief hole to relieve any excessively high pressure through the hole. However, this may degrade the frequency characteristics of the capacitive transducer, or may reduce the sensitivity within a low-frequency sound range.

Another technique is a MEMS transducer including a vibration electrode film and a plug portion separated from the vibration electrode film by slits. The plug portion is held by a support on a back plate or a substrate at the same level as the other part of the vibration electrode film. The vibration electrode film in this disclosure moves in accordance with the pressure difference across the film to enlarge the flow channel between the film and the plug portion, thus relieving an excessively high pressure (refer to, for example, Patent Literature 2).

However, the plug portion and the support in the above disclosure are separate components. This structure complicates the manufacturing processes, and may also have the plug portion falling off the support and losing its functionality. In this manner, this structure may not be highly reliable.

Patent Literature 1: Japanese Unexamined Patent Application Publication No. 2011-250170
Patent Literature 2: U.S. Pat. No. 8,737,171
Patent Literature 3: U.S. Pat. No. 8,111,871
Patent Literature 4: U.S. Pat. No. 8,983,097
Patent Literature 5: U.S. Pat. No. 9,002,037

SUMMARY

One or more aspects of the present invention are directed to a technique for maintaining good frequency characteristics in detecting an acoustic sound with a simple structure, and preventing a vibration electrode film from deforming excessively under an excessively high pressure and thus from breaking.

One aspect of the present invention provides a capacitive transducer that converts a displacement of a vibration electrode film into a change in capacitance between the vibration electrode film and a back plate. When the vibration electrode film deforms under an excessively high pressure, the vibration electrode film moves relative to a protrusion integral with the back plate. This increases an area of air flow in an airflow channel defined by a gap between the protrusion and a part of the vibration electrode film to relieve pressure applied to the vibration electrode film.

In more detail, a capacitive transducer includes a substrate having an opening in a surface thereof, a back plate facing the opening in the substrate, a vibration electrode film facing the back plate across a space, an airflow channel defined by a gap between a protrusion integral with the back plate and a part of the vibration electrode film as a pressure relief channel, and an extension formed at a periphery of a hole in the vibration electrode film defining the pressure relief channel. The vibration electrode film is displaceable to have a displacement converted into a change in capacitance between the vibration electrode film and the back plate. The airflow channel increases an area of air flow when the vibration electrode film deforms under pressure to move relative to the protrusion integral with the back plate and relieve the pressure applied to the vibration electrode film. The extension includes a slit increasing an area of the airflow channel in the hole.

In this structure, when, for example, the vibration electrode film in the capacitive transducer deforms greatly under an excessively high pressure, the vibration electrode film moves relative to the protrusion integral with the back plate, and the slit in the extension increase the area of the pressure relief channel. This structure automatically releases the pressure applied to the vibration electrode film when the vibration electrode film in the capacitive transducer deforms greatly under an excessively high pressure. Thus, the vibration electrode film is prevented from breaking under an excessively high pressure.

Also, the pressure relief channel is defined by the gap between the part of the vibration electrode film and the protrusion integral with the back plate, allowing the use of the components that typically have relative movement under pressure, and simplifying the apparatus structure.

The extension may include slits radiating from the periphery of the hole in the vibration electrode film, or may include a slit or a set of slits. More specifically, the extension may include the radiating slits defining the hole or may include a Y-shaped slit defining the hole.

The protrusion may have a wall structure placeable in the slit or the set of slits. This increases the design freedom for the slit or the set of slits, and allows selection of various slits in accordance with the specifications of an acoustic transducer such as frequency characteristics. The protrusion with the wall structure may have a width of 20 μm or less.

Another aspect of the present invention provides an acoustic sensor including the above capacitive transducer. The acoustic sensor converts a sound pressure into a change in capacitance between the vibration electrode film and the back plate, and detects the sound pressure.

The aspects may be combined as appropriate.

The capacitive transducer according to the above aspects can maintain good frequency characteristics during pressure detection, and prevents the vibration electrode film from deforming excessively in any direction under an excessively high pressure, and thus from breaking. The capacitive transducer can maintain better performance and have higher reliability.

DETAILED DESCRIPTION

First Embodiment

Embodiments of the present invention will now be described with reference to the drawings. The embodiments described below are mere examples of this invention and should not be construed as limiting the technical scope of the invention. Although the present invention is applicable to any electrostatic transducer, an electrostatic transducer used as an acoustic sensor will be described. However, a voice transducer according to the embodiments of the present invention may be used as any non-acoustic sensor for detecting the displacement of a vibration electrode film. For example, the transducer may be used as a pressure sensor, an acceleration sensor, or an inertial sensor. In addition, the transducer may be used as a non-sensor device such as a speaker for converting an electrical signal into a displacement. The components including a back plate, a vibration electrode film, a back chamber, and a substrate may have any structures, and may for example be arranged at locations reversed from the examples described below.

Figure 1:
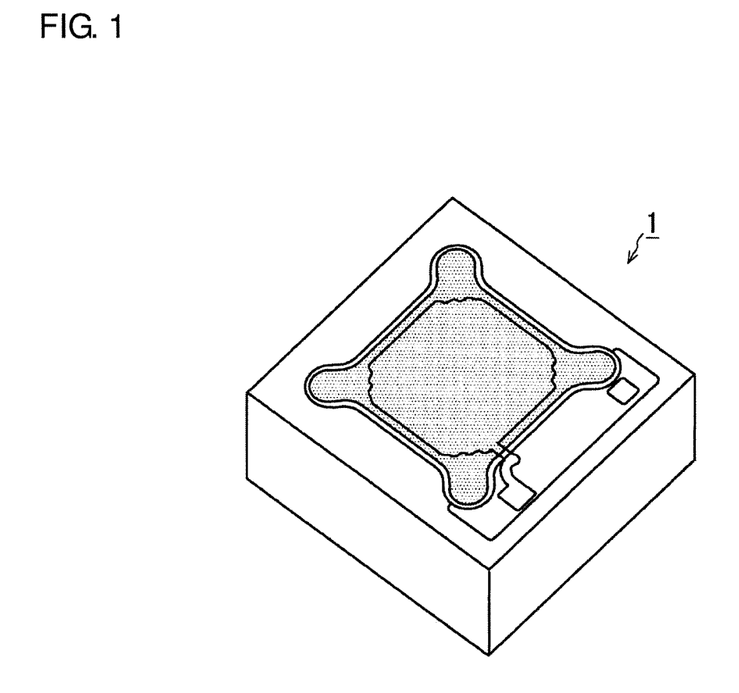
FIG. 1 is a perspective view of a known acoustic sensor fabricated using the MEMS technology.
Figure 2:
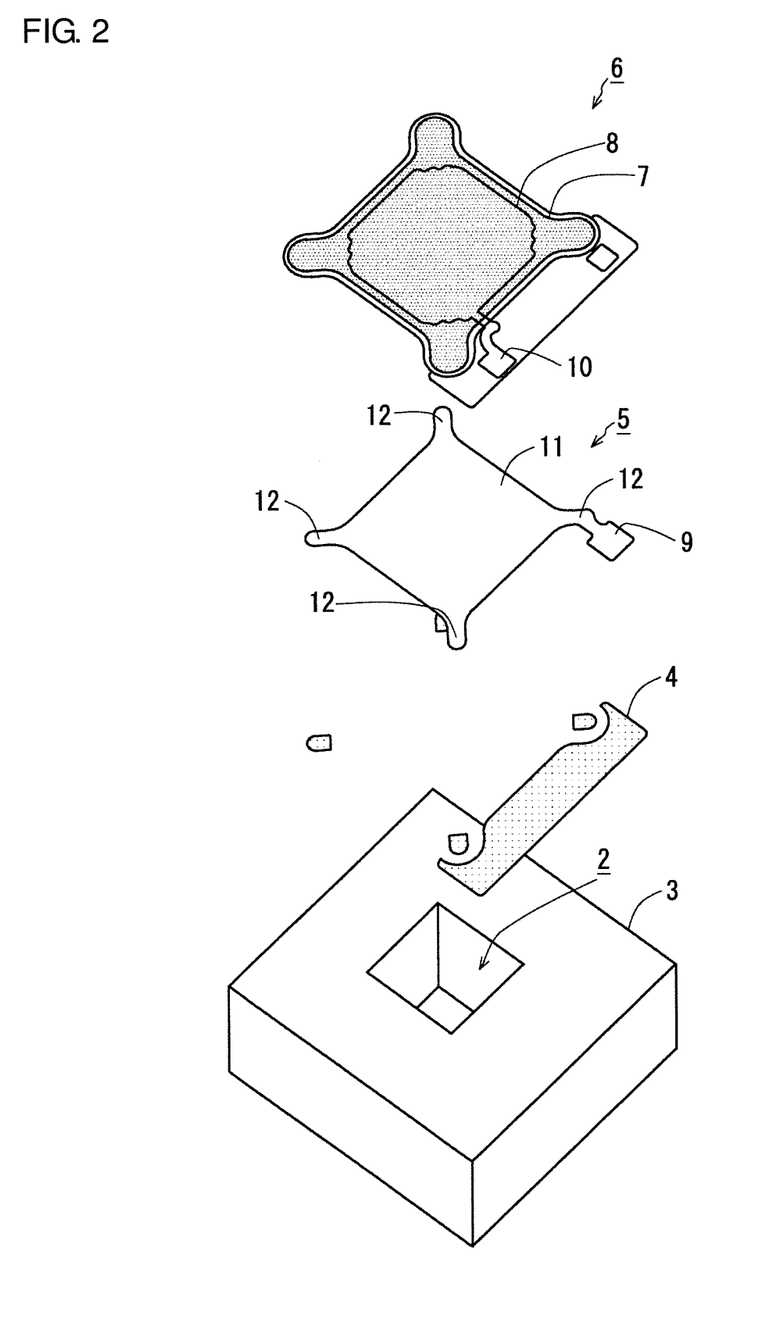
FIG. 2 is an exploded perspective view of the known acoustic sensor showing its internal structure.

FIG. 1 is a perspective view of a known acoustic sensor 1 fabricated using the micro electro mechanical system (MEMS) technology. FIG. 2 is an exploded perspective view of the acoustic sensor 1 showing its internal structure. The acoustic sensor 1 is a laminate of a silicon substrate (substrate) 3 having a back chamber 2, and a dielectric film 4, a vibration electrode film (diaphragm) 5, and a back plate 7 placed on the top surface of the silicon substrate 3. The back plate 7 includes a fixed plate 6 and a fixed electrode film 8 on the fixed plate 6 and adjacent to the silicon substrate 3. The fixed plate 6 in the back plate 7 has multiple sound holes or openings across it (the individual sound holes are indicated by the dots in the shaded area of the fixed plate 6 shown in FIGS. 1 and 2). The fixed electrode film 8 has a fixed electrode pad 10 for obtaining an output signal arranged at one of its four corners.

The silicon substrate 3 may be formed from, for example, single-crystal silicon. The vibration electrode film 5 may be formed from, for example, conductive polycrystalline silicon. The vibration electrode film 5 is thin and substantially rectangular, and has fixation parts 12 at the four corners of a substantially quadrilateral vibration part 11. The vibration electrode film 5 is located on the top surface of the silicon substrate 3 to cover the back chamber 2, and is fixed to the silicon substrate 3 at the four fixation parts 12 serving as anchor portions. The vibration part 11 of the vibration electrode film 5 vibrates vertically in response to sound pressure.

The vibration electrode film 5 is not in contact with the silicon substrate 3 nor with the back plate 7 except at its four fixation parts 12. The vibration electrode film 5 can thus vertically vibrate more smoothly in response to sound pressure. The vibration part 11 has a vibration film electrode pad 9 at one of the fixation parts 12 at the four corners. The fixed electrode film 8 on the back plate 7 corresponds to the vibration area of the vibration electrode film 5, which is the area excluding the fixation parts 12 at the four corners. The fixation parts 12 of the vibration electrode film 5 at the four corners do not vibrate in response to sound pressure and the capacitance remains unchanged between the vibration electrode film 5 and the fixed electrode film 8.

When the acoustic sensor 1 receives sound, the sound passes through the sound holes and applies sound pressure to the vibration electrode film 5. More specifically, the sound holes allow the sound pressure to be applied to the vibration electrode film 5. The sound holes also reduce thermal noise and thus reduce noise by allowing easy escape of air from the air gap between the back plate 7 and the vibration electrode film 5.

When the acoustic sensor 1 with the structure described above receives sound, the vibration electrode film 5 vibrates to change the distance between the vibration electrode film 5 and the fixed electrode film 8. In response to the change in the distance between the vibration electrode film 5 and the fixed electrode film 8, the capacitance between the vibration electrode film 5 and the fixed electrode film 8 changes. The sound pressure can be detected as an electrical signal by applying a direct current (DC) voltage across the vibration film electrode pad 9 electrically connected to the vibration electrode film 5 and the fixed electrode pad 10 electrically connected to the fixed electrode film 8, and converting the resulting change in the capacitance into an electrical signal.

Figure 3:
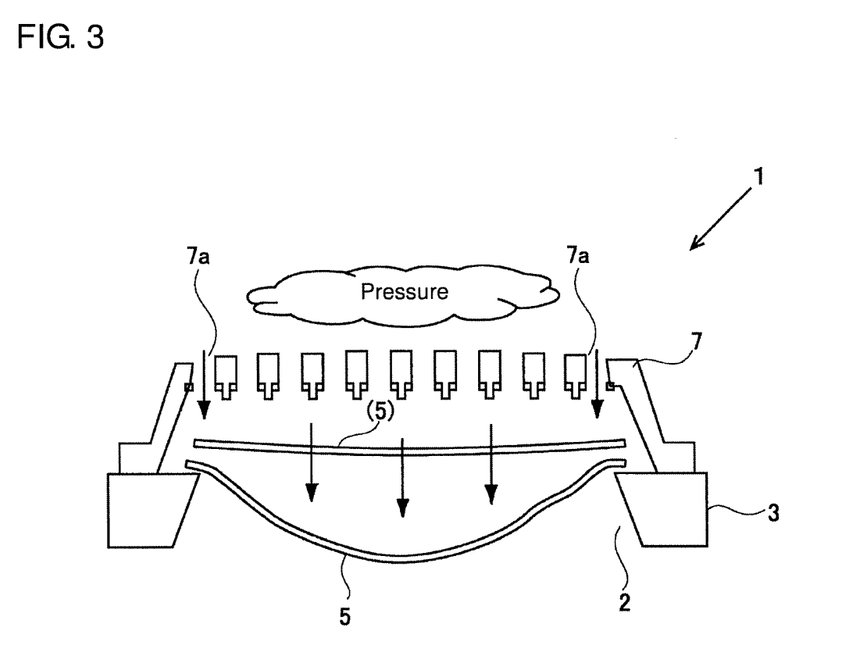
FIG. 3 is a diagram describing an acoustic sensor to which an excessively high pressure is abruptly applied.

The above acoustic sensor 1 known in the art may have the disadvantage described below. FIG. 3 is a schematic diagram showing the acoustic sensor 1 under an excessively high pressure. As shown in FIG. 3, when the acoustic sensor 1 receives an excessively high pressure, the large pressure may be applied to the vibration part 11 of the vibration electrode film 5 through sound holes 7a formed in the back plate 7. The large pressure may severely distort the vibration part 11 and break the vibration electrode film 5. This disadvantage may occur when, for example, the acoustic sensor 1 receives an excessive air pressure or when the acoustic sensor 1 falls.

Figure 4A:
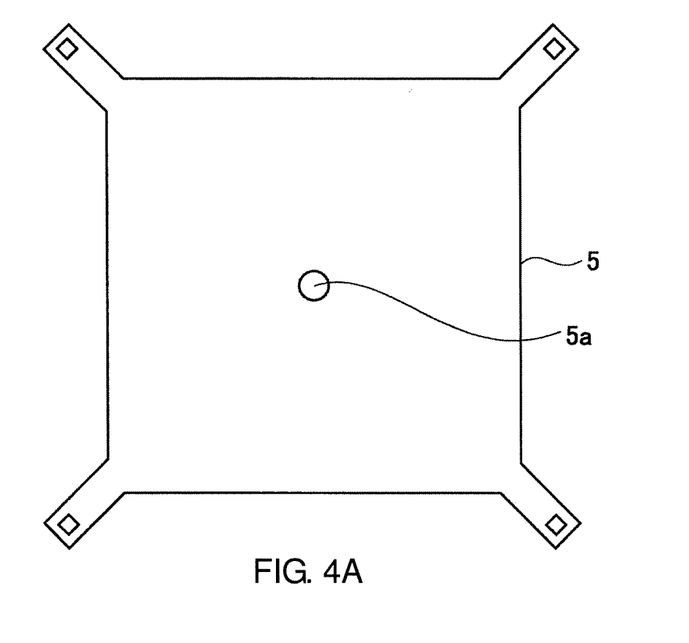
FIGS. 4A and 4B are diagrams describing a known response to an excessively high pressure abruptly applied to the acoustic sensor.
Figure 4B:
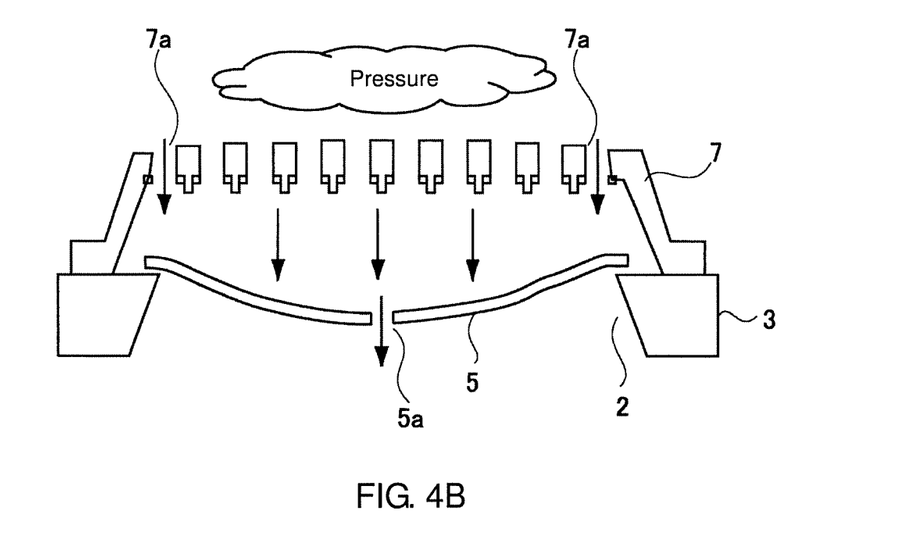

FIGS. 4A and 4B show a possible response to this. As shown in FIG. 4A, a hole 5a for relieving an applied pressure is formed in the vibration electrode film 5. As shown in FIG. 4B, an excessively high pressure applied through the sound holes 7a formed in the back plate 7 of the acoustic sensor 1 may be relieved through the hole 5a. This prevents the vibration electrode film 5 from breaking. However, although the hole 5a, which is normally open, formed in the vibration electrode film 5 improves the durability against pressure, the hole may reduce sensitivity, or may cause roll-off, particularly within a low-frequency sound range, and may degrade the frequency characteristics of the acoustic sensor 1.

Another response may be a vibration electrode film, and a plug portion separated from the vibration electrode film by slits included as a pressure relief measure. The plug portion may be held by a support on a back plate at the same level as the other part of the vibration electrode film. This vibration electrode film moves in accordance with the pressure difference across the film to enlarge the flow channel between the film and the plug portion, and the enlarged channel allows an excessively high pressure to be relieved (refer to, for example, Patent Literature 2).

However, this response has disadvantages described below. For example, the plug portion is fragile because it is a part of the very thin vibration electrode film. The lid-like plug portion is supported on the back plate using the support that is formed from a separate rod member. This complicates the manufacturing processes, and may cause the plug portion to come off the support.

Further, this vibration electrode film moves in accordance with the pressure difference across the film to enlarge the flow channel between the vibration electrode film and the plug portion, which is separated from the vibration electrode film by the slits. The enlarged channel then allows an excessively high pressure to be relieved. More specifically, the flow channel corresponds to the gap between the thin films, which are the vibration electrode film and the plug portion separated from the vibration electrode film by the slits. Thus, when the amplitude of the vibration electrode film increases under a relatively large pressure, which is within an operable pressure range, the plug portion and the vibration electrode film may deviate from each other beyond their film thickness. The resulting larger flow channel may cause unstable frequency characteristics of the acoustic sensor 1.

In response to the above disadvantage, the vibration electrode film according to the present embodiment has a hole for relieving any applied pressure. Before the vibration electrode film deforms, a column integral with and protruding from a back plate passes through and partially blocks the hole. When the vibration electrode film deforms under pressure, the relative movement of the vibration electrode film and the back plate causes the back plate column to withdraw from the hole and uncover the entire hole, through which the pressure applied to the vibration electrode film is relieved. The vibration electrode film further has an extension defined by a slit on the periphery of the hole to allow pressure relief in a larger area and thus more efficient relief of the pressure.

Figure 5A:
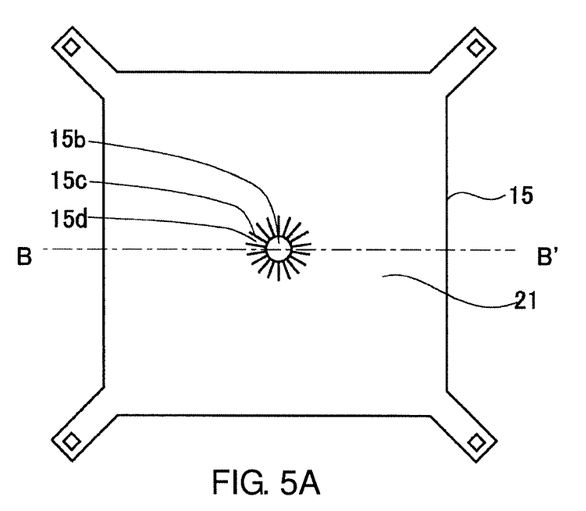
FIGS. 5A and 5B are diagrams of an acoustic sensor according to a first embodiment of the present invention showing a vibration electrode film and a part around a back plate.
Figure 5B:
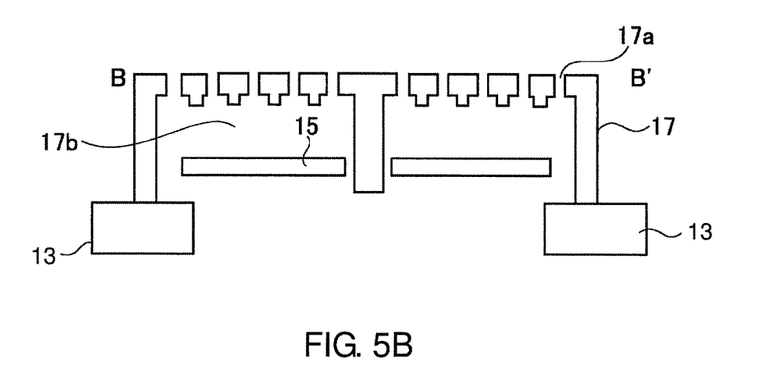

FIGS. 5A and 5B are schematic diagrams of an acoustic sensor according to the present embodiment showing a vibration electrode film 15 and a part around a back plate 17. FIG. 5A is a plan view of the vibration electrode film 15. FIG. 5B is a cross-sectional view of the vibration electrode film 15, the back plate 17, and a substrate 13 taken along line B-B'. As shown in FIG. 5A, the vibration electrode film 15 according to the present embodiment has a pressure relief hole 15b at the center of its vibration part 21. The pressure relief hole 15b in the vibration electrode film 15 has an extension 15d, which is defined by slits 15c radiating from the periphery of the hole.

As shown in FIG. 5B, a columnar protrusion 17b integral with the back plate 17 passes through and blocks the pressure relief hole 15b before the vibration electrode film 15 receives an excessively high pressure. The protrusion 17b is a part of the back plate 17 that is formed when the back plate 17 is prepared through semiconductor manufacturing processes.

Figure 6A:
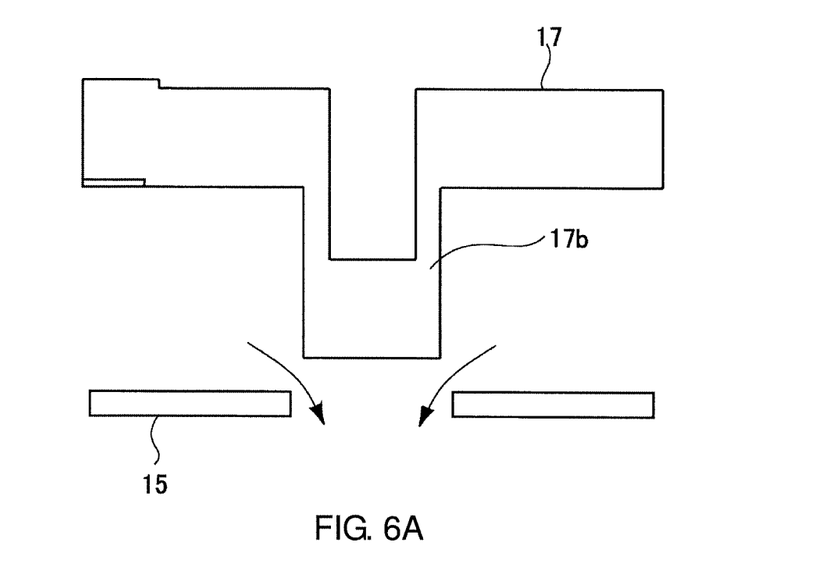
FIGS. 6A and 6B are diagrams describing the functions of a pressure relief hole and a protrusion according to a first embodiment of the present invention.
Figure 6B:
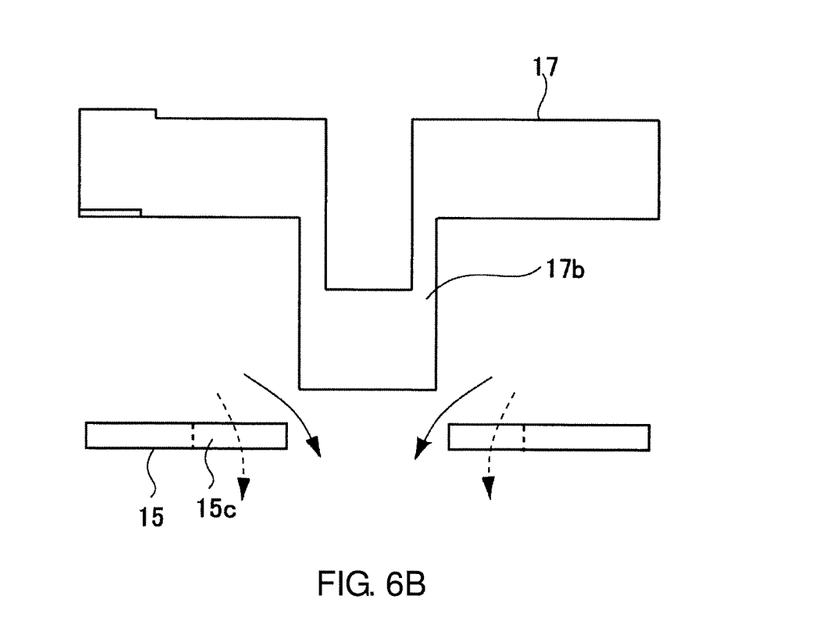

The functions of the pressure relief hole 15b and the protrusion 17b will now be described with reference to FIGS. 6A and 6B. FIGS. 6A and 6B are diagrams of the pressure relief hole and the protrusion according to the first embodiment of the present invention describing their functions. FIG. 6A is a diagram showing the vibration electrode film 15 without the extension 15d, which is under an excessively high pressure. FIG. 6B is a diagram describing escape of air from the pressure relief hole 15b and the slits 15c when the vibration electrode film 15 with the extension 15d is under an excessively high pressure. As shown in FIG. 6A, the protrusion 17b on the back plate 17 may pass through and block the pressure relief hole 15b in the vibration electrode film 15. Without the extension 15d, the pressure relief hole 15b allows less air to pass, and insufficiently relieves pressure under pressure applied to the vibration electrode film 15 from across the back plate 17.

Figure 7A:
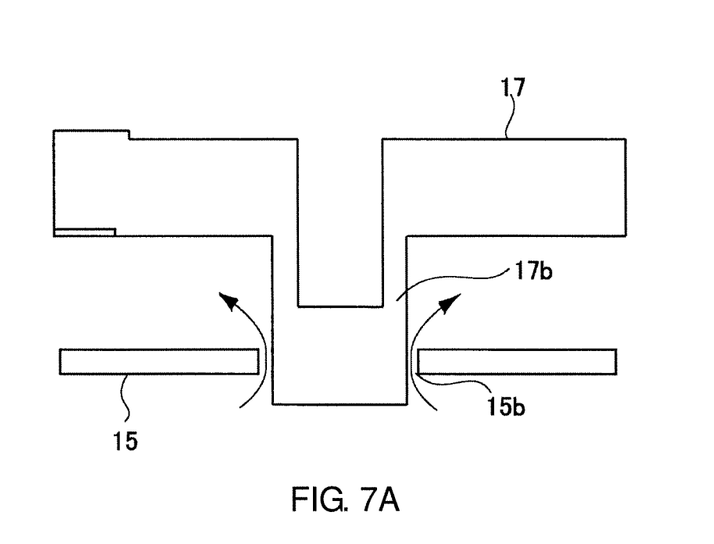
FIGS. 7A and 7B are diagrams describing the function of a movable member according to the first embodiment of the present invention.
Figure 7B:
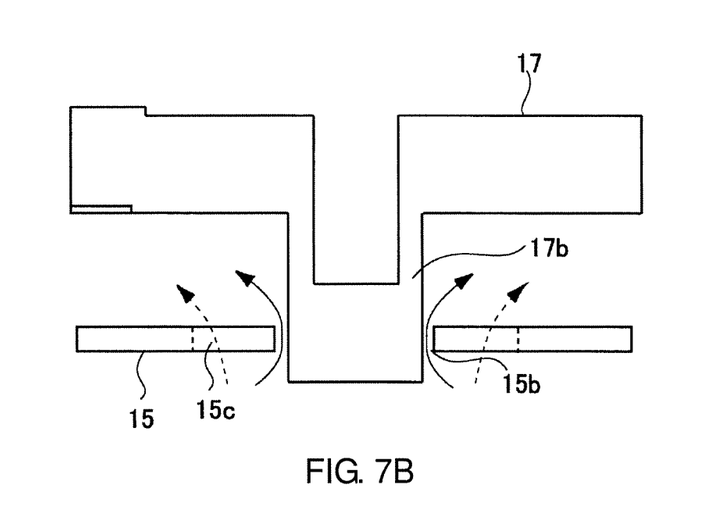

In contrast, the extension 15d allows escape of air through the pressure relief hole 15b and also through the slits 15c as shown in FIG. 7B. The extension 15d increases the area of air passage and also allows passage of air at positions away from the pressure relief hole 15b. This represents air escape in a larger area, and thus more efficient escape of air. This structure prevents the vibration electrode film 15 from breaking. The slits 15c, which are long and narrow, prevent an excessive increase in the area of air passage and thus prevent the frequency characteristics from deteriorating, and facilitate movement of air across a broader area. The slits 15c extend from the pressure relief hole 15b, and thus can reduce an interference between the air passing through the slits 15c and the air passing through the pressure relief hole 15b in a wide range, thus effectively balancing the pressure.

The function of the extension 15d will now be described with reference to FIGS. 7A and 7B. FIGS. 7A and 7B are diagrams describing the function of the extension 15d according to the first embodiment of the present invention.

FIG. 7A is a diagram showing the vibration electrode film 15 without the extension 15d under an excessively high pressure. FIG. 7B is a diagram describing escape of air from the pressure relief hole 15b and the slits 15c after the vibration electrode film 15 with the extension 15d receives an excessively high pressure. As shown in FIG. 7A, the protrusion 17b on the back plate 17 may pass through and block the pressure relief hole 15b in the vibration electrode film 15. Without the extension 15d, the pressure relief hole 15b allows less air to pass, and insufficiently relieves pressure under pressure applied to the vibration electrode film 15 from across the back plate 17.

As shown in FIG. 7B, the extension 15d allows air to escape through the slits 15c, in addition to the air escaping through the pressure relief hole 15b. This structure increases the area of air passage, and allows passage of air at positions away from the pressure relief hole 15b. This represents air escape in a larger area, and thus more efficient escape of air. This structure prevents the vibration electrode film 15 from breaking. The slits 15c, which are long and narrow, prevent an excessive increase in the area of air passage and thus preventing the frequency characteristics from deteriorating, and facilitate movement of air across a broader area. Although the pressure relief hole 15b can have an area for air escape that changes depending on the relative positions between the pressure relief hole 15b and the protrusion 17b on the back plate 17, the slits 15c have a constant area of air passage, and thus enable constant relief of pressure.

As described above in the present embodiment, the protrusion 17b passes through and blocks the pressure relief hole 15b during normal operation, in which the vibration electrode film 15 is not under an excessively high pressure and not deforming excessively. This structure thus prevents the frequency characteristics of the acoustic sensor 1 from deteriorating. Under an excessively high pressure, the vibration electrode film 15 deforms greatly to cause the protrusion 17b to withdraw from the pressure relief hole 15b (the protrusion 17b to no longer pass through the pressure relief hole 15b) and uncover the hole, thus sufficiently relieving pressure through the pressure relief hole 15b. This structure prevents the vibration electrode film 15 from deforming further, thus preventing the vibration electrode film 15 from breaking under an excessively high pressure applied to the acoustic sensor 1.

In the present embodiment, the functions described above are achieved by the relative movement of the protrusion 17b integral with the back plate 17 and the pressure relief hole 15b formed in the vibration electrode film 15. This simplifies the structure and increases the reliability.

Second Embodiment

Figure 8A:
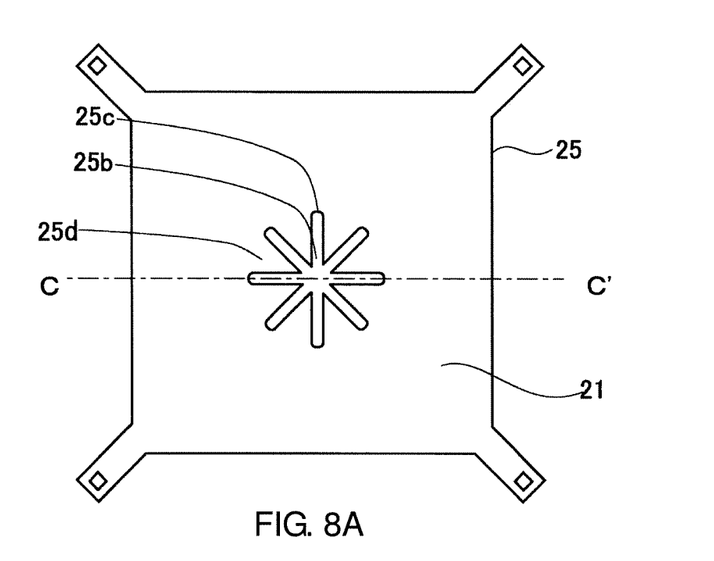
FIGS. 8A and 8B are schematic diagrams of an acoustic sensor according to a second embodiment of the present invention showing a vibration electrode film and a part around a back plate.
Figure 8B:
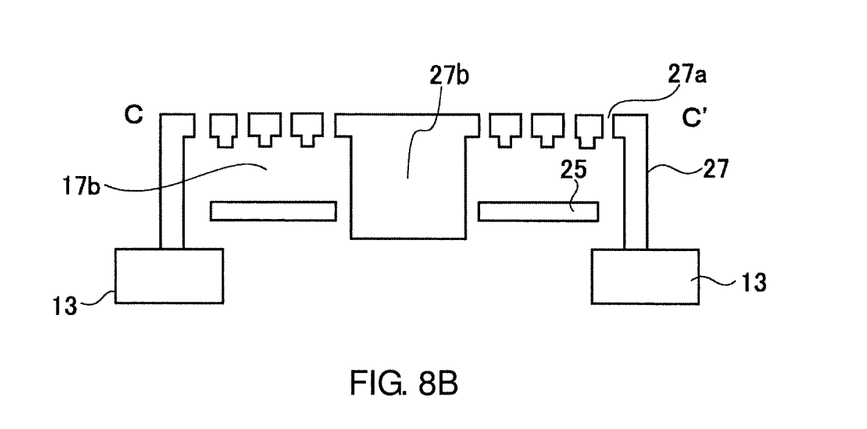

A second embodiment of the present invention will now be described. FIGS. 8A and 8B are schematic diagrams of an acoustic sensor according to the second embodiment showing a vibration electrode film 25 and a part around a back plate 27. FIG. 8A is a plan view of the vibration electrode film 25. FIG. 8B is a cross-sectional view of the vibration electrode film 25, the back plate 27, and a substrate 13 taken along line C-C'. As shown in FIG. 8A, the vibration electrode film 25 according to the present embodiment (second embodiment) has a pressure relief hole 25b, which includes slits radiating from the center. The pressure relief hole 25b has an extension 25d, which is defined by slits radiating from the periphery of the hole. As shown in FIG. 8B, a protrusion 27b, which is a radial wall integral with the back plate 27, passes through the pressure relief hole 25b and blocks the hole before the vibration electrode film 25 receives an excessively high pressure. The protrusion 27b is a part of the back plate 27 that is formed when the back plate 27 is prepared through semiconductor manufacturing processes.

In the second embodiment, as in the first embodiment, the protrusion 27b on the back plate 27 passes through and blocks the pressure relief hole 25b before the vibration electrode film 25 deforms. In this state, the pressure relief hole 25b allows less air to pass, and insufficiently relieves pressure under pressure applied to the vibration electrode film 25 from across the back plate 27. Under an excessively high pressure applied to the vibration electrode film 25 from across the back plate 27, the vibration electrode film 25 deforms away from the back plate 27. This causes the protrusion 27b to withdraw from the pressure relief hole 25b (the protrusion to no longer pass through the hole) and uncover the pressure relief hole 25b. The air applying the pressure to the vibration electrode film 25 passes through the pressure relief hole 25b downward in the figures, thus preventing the vibration electrode film 25 from breaking.

Under an excessively high pressure applied to the vibration electrode film 25 from its side opposite to the back plate 27, the pressure is relieved through the pressure relief hole 25b and also through slits 25c. The slits 25c increase the area of air passage and also allow passage of air in a broad area of the vibration electrode film 25. This represents air escape in a larger area, and thus more efficient escape of air. This structure prevents the vibration electrode film 25 from breaking. The slits 25c, which are long and narrow, prevent an excessive increase in the area of air passage and thus prevent the frequency characteristics from deteriorating, and facilitate movement of air in a broader area. The slits 25c extend from the pressure relief hole 25b, and thus can reduce an interference between the air passing through the slits 25c and the air passing through the pressure relief hole 25b in a wide range, thus effectively balancing the pressure. The slits 25c radiate in an axisymmetric manner, and thus can relieve pressure efficiently in any direction.

The protrusion 27b integral with the back plate 27, which is a radial wall, practically functions as a beam for reinforcing the thin back plate 27, and strengthens the back plate 27.

Third Embodiment

Figure 9A:
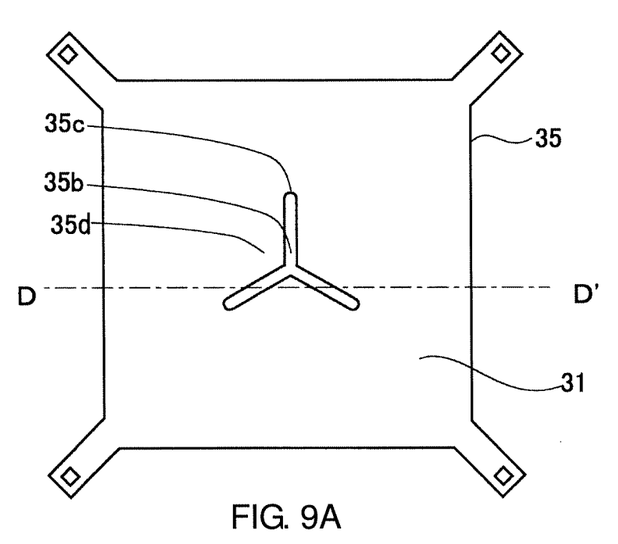
FIGS. 9A and 9B are schematic diagrams of an acoustic sensor according to a third embodiment of the present invention showing a vibration electrode film and a part around a back plate.
Figure 9B:
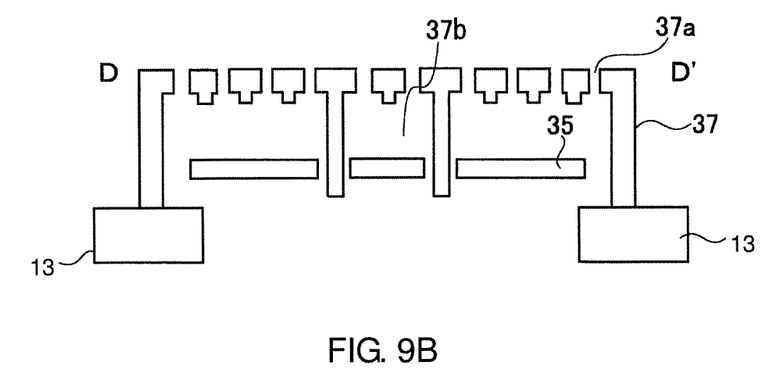

A third embodiment of the present invention will now be described. FIGS. 9A and 9B are schematic diagrams of an acoustic sensor according to the third embodiment showing a vibration electrode film 35 and a part around a back plate 37. FIG. 9A is a plan view of the vibration electrode film 35. FIG. 9B is a cross-sectional view of the vibration electrode film 35, the back plate 37, and a substrate 13 taken along line D-D'. As shown in FIG. 9A, the vibration electrode film 35 according to the third embodiment has, at its center, a pressure relief hole 35b including three slits at angular intervals of 120 degrees forming a Y-shape as viewed from above. The pressure relief hole 35b has an extension 35d, which is defined by the Y-shaped slits. As shown in FIG. 9B, a protrusion 37b, which is a Y-shaped wall integral with the back plate 37, passes through the pressure relief hole 35b and blocks the hole before the vibration electrode film 35 receives an excessively high pressure. The protrusion 37b is a part of the back plate 37 that is formed when the back plate 37 is prepared through semiconductor manufacturing processes.

In the third embodiment, as in the first embodiment, the protrusion 37b on the back plate 37 passes through and blocks the pressure relief hole 35b before the vibration electrode film 35 deforms. In this state, the pressure relief hole 35b allows less air to pass, and insufficiently relieves pressure under pressure applied to the vibration electrode film 35 from across the back plate 37. Under an excessively high pressure applied to the vibration electrode film 35 from across the back plate 37, the vibration electrode film 35 deforms away from the back plate 37. This causes the protrusion 37b to withdraw from the pressure relief hole 35b (the protrusion to no longer pass through the hole) and uncover the pressure relief hole 35b. The air applying the pressure to the vibration electrode film 35 passes through the pressure relief hole 35b downward in the figures, thus preventing the vibration electrode film 35 from breaking.

When an excessively high pressure is applied to the vibration electrode film 35 from its side opposite to the back plate 37, the pressure is relieved through the pressure relief hole 35b and also through slits 35c. The slits 35c increase the area of air passage and allow passage of air in a broad area of the vibration electrode film 35. This represents air escape in a larger area, and thus more efficient escape of air. This structure prevents the vibration electrode film 35 from breaking. The slits 35c forming a Y-shape allows a smaller area of air passage in the pressure relief hole 35b than the radiating slits. This structure more effectively prevents the sensitivity from deteriorating in a row-frequency range, or from causing roll-off. This pressure relief hole can have longer slits providing the same area of air passage as in the other examples, and thus can extend in a broader area in the vibration electrode film, thus more effectively preventing the vibration electrode film from breaking.

The protrusion 37b integral with the back plate 37, which is a Y-shaped wall, practically functions as a beam for reinforcing the thin back plate 37, and strengthens the back plate 37.

The extension may not have the structures described in the first to third embodiments described above, and may have any other structure.

Figure 10:
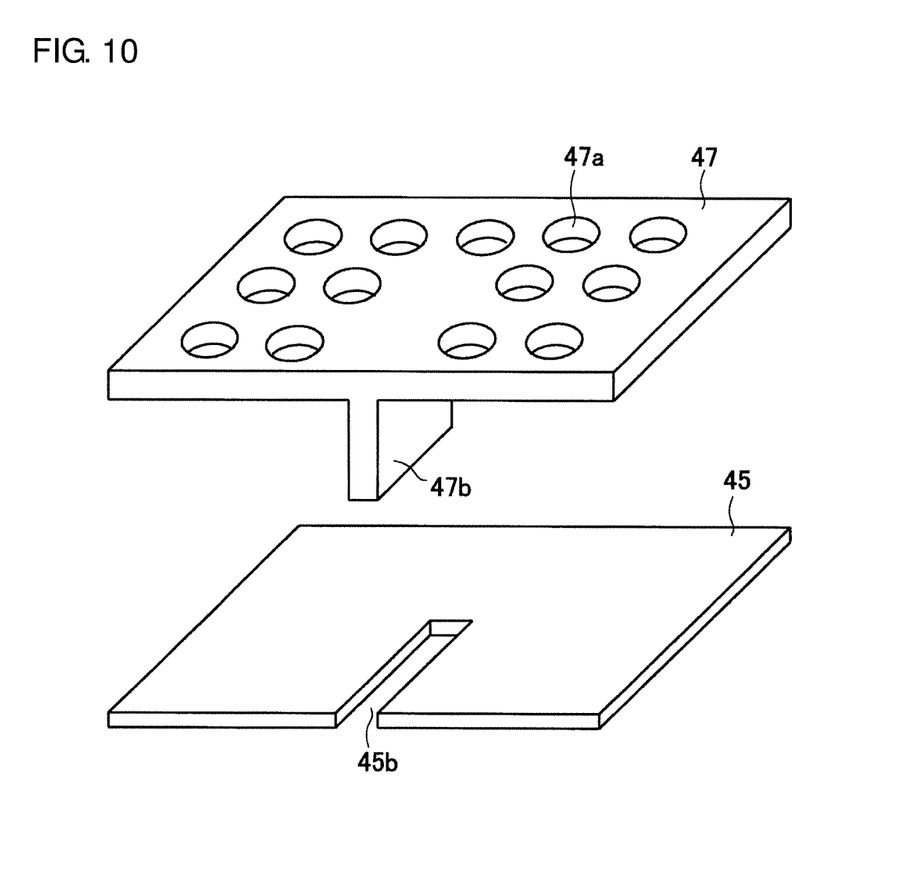
FIG. 10 is a perspective cross-sectional view of a protrusion with a wall structure formed on a back plate and a pressure relief slit formed in a vibration electrode film.

FIG. 10 is a perspective cross-sectional view showing a back plate 47 including a protrusion 47b with a wall structure as described in the second embodiment and the third embodiment, a vibration electrode film 45, and a pressure relief hole 45b. As described above, the pressure relief hole 45b in the present embodiment is a slit (instead of a circle) as viewed from above. The protrusion 47b with a wall structure can be placed in the pressure relief hole 45b, which is a slit. FIG. 10 is a cross-sectional view of the vibration electrode film 45 and the back plate 47 taken along the center of the pressure relief hole 45b as a slit and the protrusion 47b as a wall.

In this modification, the portion of the back plate 47 immediately above the protrusion 47b is flat. This structure reduces stress concentration, and also increases the thickness of the back plate 47 and thus strengthens the back plate 47.

Figure 11A:
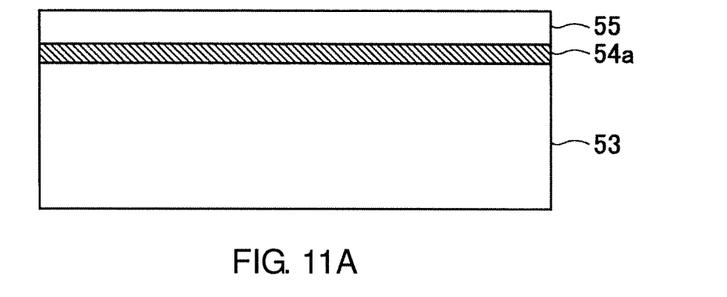
FIGS. 11A to 11C are first diagrams describing the process of forming a protrusion with a wall structure formed on a back plate and a pressure relief slit formed in a vibration electrode film.
Figure 11B:
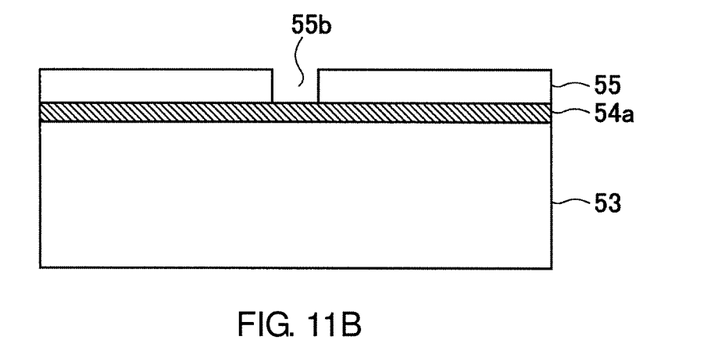

The process of forming the protrusion with the wall structure described in each of the second and third embodiments and the pressure relief hole will now be described with reference to FIGS. 11A to 12C. As shown in FIG. 11A, a silicon dioxide (SiO2) insulator layer 54a is first formed on the surface of a silicon (Si) substrate 53, and a polysilicon (poly-Si) film 55 to be a vibration electrode film is formed on the insulator layer 54a. As shown in FIG. 11B, the poly-Si film 55 to be a vibration electrode film is partially removed by etching to define a pressure relief hole 55b.

Figure 11C:
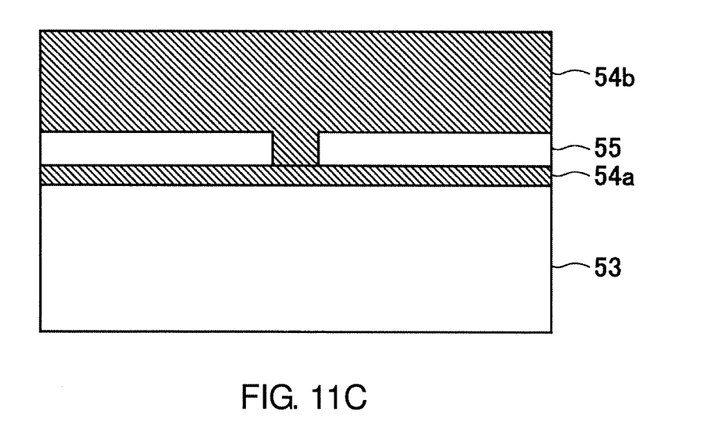
Figure 12A:
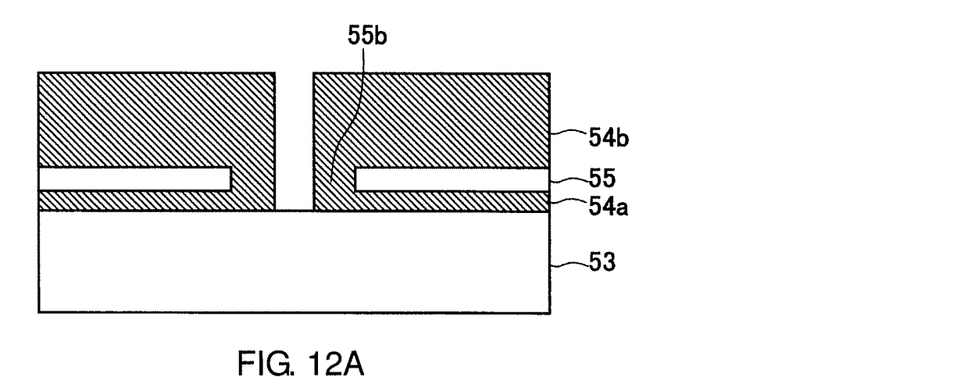
FIGS. 12A to 12C are second diagrams describing the process of forming a protrusion with a wall structure formed on a back plate and a pressure relief slit formed in a vibration electrode film.

As shown in FIG. 11C, a SiO2 sacrificial layer 54b is then formed on the poly-Si film 55. As shown in FIG. 12A, the insulator layer 54a and the sacrificial layer 54b are partially removed by etching to leave a part to be a protrusion with a wall structure.

Figure 12B:
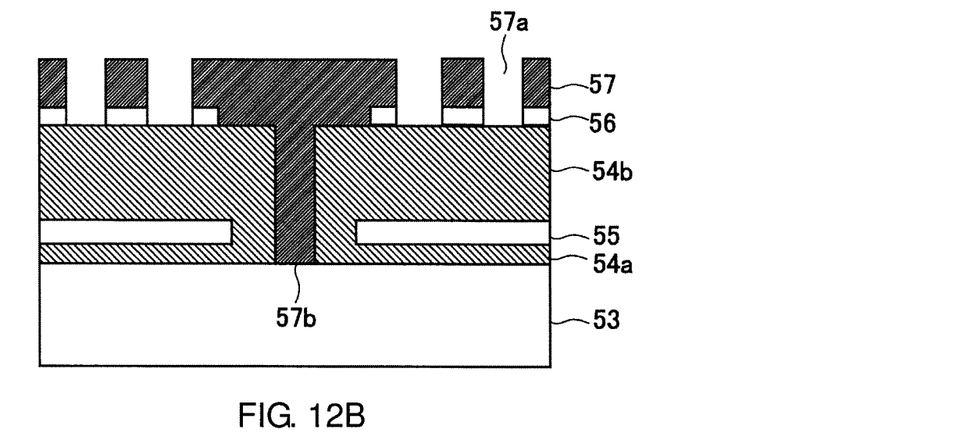

As shown in FIG. 12B, a poly-Si film 56 to be a fixed electrode and a silicon nitride (SiN) film 57 to be a back plate and the protrusion with the wall structure are then formed. When the film to be the back plate 57 is formed, the narrow slit in the SiO2 insulator layer 54a and the SiO2 sacrificial layer 54b, in which a SiN film 57b is formed, is completely filled with the SiN film, causing the protrusion 57b to be a wall. When the width of the slit is within the thickness twice the thickness of the back plate film or the sacrificial layer, the slit is filled completely and the back plate is likely to be flat. In a capacitive transducer with a typical size using the MEMS technology, the slit may usually have a width of 20 μm.

Figure 12C:
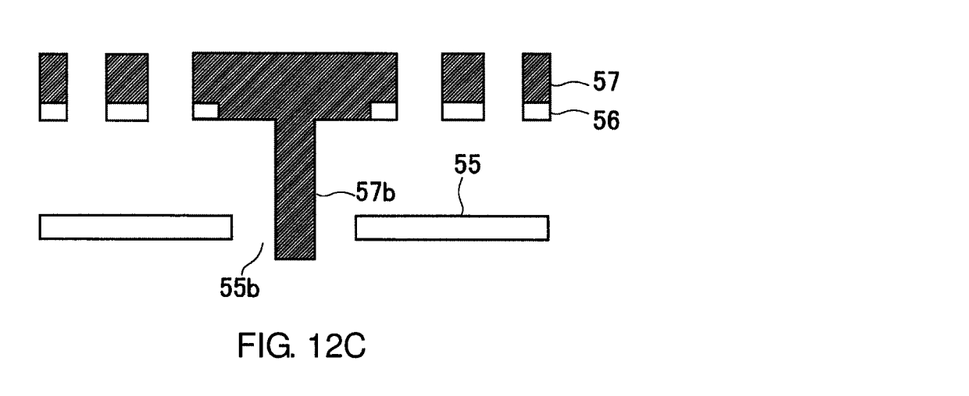

Then, sound holes 57a are formed by etching. As shown in FIG. 12C, the Si substrate 53, the insulator layer 54a, and the sacrificial layer 54b are then removed by etching with the back plate 57, the portion to be the protrusion 57b, and the vibration electrode film 55 left unremoved. This forms the protrusion with the wall structure 57b on the back plate 57 and the pressure relief hole 55b in the vibration electrode film 55.

REFERENCE SIGNS LIST 1 acoustic sensor
2 back chamber
3 (silicon) substrate
5, 15, 25, 35 vibration electrode film
7, 17, 27, 37 back plate
15b, 25b, 35b pressure relief hole
15c, 25c, 35c slit
15d, 25d, 35d extension
17b, 27b, 37b protrusion

The invention claimed is:
1. A capacitive transducer, comprising:
a substrate having an opening in a surface thereof;
a back plate facing the opening in the substrate;
a vibration electrode film facing the back plate across a space, the vibration electrode film being displaceable to have a displacement converted into a change in capacitance between the vibration electrode film and the back plate;
an airflow channel defined by a gap between a protrusion integral with the back plate and a part of the vibration electrode film, the airflow channel being configured to increase an area of air flow when the vibration electrode film deforms under pressure to move relative to the protrusion integral with the back plate and relieve the pressure applied to the vibration electrode film to serve as a pressure relief channel; and
an extension formed at a periphery of a hole in the vibration electrode film defining the pressure relief channel, the extension including a slit increasing an area of the airflow channel in the hole.
2. The capacitive transducer according to claim 1, wherein the extension includes slits in the vibration electrode film, and the slits radiate from the periphery of the hole.
3. The capacitive transducer according to claim 1, wherein the extension includes a slit defining the hole or includes a set of slits defining the hole.
4. The capacitive transducer according to claim 3, wherein the set of slits radiates.

5. The capacitive transducer according to claim 3, wherein the slit has a Y-shape.

6. The capacitive transducer according to claim 4, wherein the protrusion has a wall structure placeable in the slit or the set of slits.

7. The capacitive transducer according to claim 6, wherein the protrusion with the wall structure has a width of 20 μm or less.

8. An acoustic sensor comprising:
the capacitive transducer according to claim 1,
wherein the acoustic sensor is configured to convert a sound pressure into a change in capacitance between the vibration electrode film and the back plate, and detect the sound pressure.

9. The capacitive transducer according to claim 5, wherein the protrusion has a wall structure placeable in the slit or the set of slits.

10. An acoustic sensor comprising:
the capacitive transducer according to claim 2,
wherein the acoustic sensor is configured to convert a sound pressure into a change in capacitance between the vibration electrode film and the back plate, and detect the sound pressure.

11. An acoustic sensor comprising:
the capacitive transducer according to claim 3,
wherein the acoustic sensor is configured to convert a sound pressure into a change in capacitance between the vibration electrode film and the back plate, and detect the sound pressure.

12. An acoustic sensor comprising:
the capacitive transducer according to claim 4,
wherein the acoustic sensor is configured to convert a sound pressure into a change in capacitance between the vibration electrode film and the back plate, and detect the sound pressure.

13. An acoustic sensor comprising:
the capacitive transducer according to claim 5,
wherein the acoustic sensor is configured to convert a sound pressure into a change in capacitance between the vibration electrode film and the back plate, and detect the sound pressure.

14. An acoustic sensor comprising:
the capacitive transducer according to claim 6,
wherein the acoustic sensor is configured to convert a sound pressure into a change in capacitance between the vibration electrode film and the back plate, and detect the sound pressure.

15. An acoustic sensor comprising:
the capacitive transducer according to claim 7,
wherein the acoustic sensor is configured to convert a sound pressure into a change in capacitance between the vibration electrode film and the back plate, and detect the sound pressure.

* * * * *